(12) United States Patent
Wegh et al.

(10) Patent No.: US 7,917,188 B2
(45) Date of Patent: Mar. 29, 2011

(54) METHOD FOR USING CEST CONTRAST AGENTS IN MRI

(75) Inventors: Rene Theodorus Wegh, Eindhoven (NL); Jeroen Alphons Pikkemaat, Eindhoven (NL); Nicolaas Petrus Willard, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 651 days.

(21) Appl. No.: 11/912,691

(22) PCT Filed: Apr. 21, 2006

(86) PCT No.: PCT/IB2006/051237
§ 371 (c)(1),
(2), (4) Date: Oct. 26, 2007

(87) PCT Pub. No.: WO2006/114739
PCT Pub. Date: Nov. 2, 2006

(65) Prior Publication Data
US 2008/0188738 A1 Aug. 7, 2008

(30) Foreign Application Priority Data
Apr. 26, 2005 (EP) .................................... 05103355

(51) Int. Cl.
*A61B 5/05* (2006.01)
(52) U.S. Cl. ........ 600/407; 600/420; 324/306; 324/307; 324/309; 424/9.36; 424/9.361; 424/9.364; 424/9.365; 424/9.393; 540/465; 540/474

(58) Field of Classification Search ............... 424/9.393, 424/1.65, 1.77, 9.36, 9.361, 9.363, 9.364, 424/9.365; 540/474, 465
See application file for complete search history.

(56) References Cited

U.S. PATENT DOCUMENTS

| | | |
|---|---|---|
| 6,746,662 B1 | 6/2004 | Sherry et al. |
| 2002/0127182 A1 | 9/2002 | Sherry et al. |
| 2004/0030239 A1 | 2/2004 | Van Zijl et al. |
| 2004/0058951 A1 | 3/2004 | Lanza et al. |

FOREIGN PATENT DOCUMENTS

| | | |
|---|---|---|
| EP | 1331012 A1 | 7/2003 |
| WO | 0066180 | 11/2000 |
| WO | 2004065385 A1 | 8/2004 |

OTHER PUBLICATIONS

Wegh R et al: "CEST With Paramagnetic", Society for Molecular Imaging, 4th Annual Meeting, 2005, XP002425241.
Zhou et al: "Chemical Exchange Saturation", Progress in NMR Spectroscopy, Pergamon Press, vol. 48, No. 2-3, pp. 109-136, 2006,XP005458464.

(Continued)

*Primary Examiner* — Long V Le
*Assistant Examiner* — Nicholas L Evoy (57) ABSTRACT

A method for mapping a physico-chemical parameter using a chemical exchange saturation transfer contrast agent in Magnetic Resonance Imaging is used with agents having only one exchangeable entity pool, e.g. proton pool, by applying two different RF frequencies for pre-saturation of the contrast agent.

14 Claims, 8 Drawing Sheets

OTHER PUBLICATIONS

Ward K M et al: "Determination of PH Using Water Protons", Magnetic Resonance in Medicine, Academic Press, vol. 44, No. 5, pp. 799-802, 2000, XP000969765.

Gillies R J et al: "PH Imaging a Review of PH Measurement Methods", IEEE Engineering in Medicine and Biology Magazine, IEEE Service Center, vol. 23, No. 5, pp. 57-64, 2004, XP001234807.

Kimura E, et al: "A TRIS(ZnII-1,4,7,10-Tetraazacyclododecane) Complex As a New Receptor", Journal of American Chemistry Society, 119, pp. 3068-3076, 1997.

A. Heppeler et al: "Radiometal-Labelled Macrocyclic Chelator-Derivatised Somatostatin", Chem. Eur. J., vol. 5, No. 7, pp. 1974-1981, 1999.

METHOD FOR USING CEST CONTRAST AGENTS IN MRI

The present invention relates to magnetic resonance imaging. More particularly, the invention relates to a method for using contrast agents in Magnetic Resonance Imaging (MRI).

Magnetic Resonance Imaging (MRI) is one of the major imaging techniques in medicine and is one of the main carriers for molecular imaging. Images are obtained by applying a strong magnetic field, a magnetic-field gradient, and frequency-matched (RF) pulses to a patient. During the imaging process, atomic nuclei in the body, which have a magnetic moment, mostly protons of water and fat molecules, become excited by the RF radiation. When the RF pulse is stopped, relaxation of the excited nuclei causes emission of an RF signal. As a result of applied magnetic-field gradients, the frequencies in this emitted RF signal contain spatial information and can be used to construct an image.

Sometimes the difference in MRI signal intensity, i.e. contrast, between different tissues is not sufficient to obtain satisfactory clinical information and MRI contrast agents are then used. Nowadays, the use of contrast agents (CA) in MRI is growing. Current contrast agents comprise (super)paramagnetic materials, which influence the relaxation process of the nearby water $^1H$ nuclei and so lead to a local change of the image contrast.

Molecular imaging aims at in vivo characterization of biological pathways. This will enable detection of diseases in a much earlier stage than at present. To achieve this, specially designed contrast agents are required, that either bind with markers of the biological process to be studied (targeted contrast agents), or that give a different MR signal at the site of the biological process to be studied (responsive, smart or sensor contrast agents). This difference in MR signal can be induced by a difference in e.g. pH, temperature, or metabolite concentration. The imaging of pH can for example enable detection of small cancer lesions, since the pH at such a site is lowered due to reduced buffering capacity and increased lactic acid production. Similarly, the mapping of temperature can detect sites of inflammation.

WO 00/66180 to Balaban et al. describes a method for enhancing contrast produced in MRI by performing 'Chemical Exchange Dependent Saturation Transfer', now called 'Chemical Exchange Saturation Transfer' (CEST). With this CEST technique, the image contrast is obtained by altering the intensity of the water proton signal. This is done by selectively saturating a pool of exchangeable protons of the CEST contrast agent, by using an RF pulse. These protons subsequently transfer the saturation to nearby water by exchange with water protons, thereby decreasing the water proton signal.

Features of working embodiments in WO 00/66180 include some or all of the following: selecting one or more contrast agents; administering same or a composition containing same to a subject; irradiating, and thereby saturating, (exchangeable) protons of the contrast agent at a first predetermined frequency ($+\Delta\omega_{CA}$) of the water proton signal and providing an image; irradiating at a second predetermined frequency ($-\Delta\omega_{CA}$), which may also be called off-resonance, of the water proton signal and providing a second image; and determining a third image provided by the subtraction or ratio of the first image relative to the second image, $\pm\Delta\omega_{CA}$ referring to the chemical shift difference between the resonance of an exchangeable entity, e.g. an exchangeable proton, water molecule or phosphate group, of a contrast agent and the water proton resonance.

The extent of water proton signal decrease depends on the proton exchange rate and on the concentration of the exchangeable protons. Since the proton exchange rate usually depends on pH, this method enables pH mapping.

It is shown in WO 00/66180 that in pH mapping using the CEST technique, the dependency of the concentration of the contrast agent can be eliminated with a single CEST contrast agent having two exchangeable-proton pools. These proton pools should have different resonance frequencies so that they can be saturated separately, and a different dependence of proton exchange on pH.

A CEST agent that fulfils these conditions and was measured by Balaban et al. is 5,6-dihydrouracil. The CEST effects for the two proton pools at 5.00 and 2.67 ppm have different pH dependence.

The approach developed by Balaban is called the 'ratiometric method', the principle of which is explained as follows. Basically, the decrease of the water proton signal due to CEST can be described by equation 1:

$$\frac{M_s}{M_0^*} = \frac{1}{1 + k_{CA}[CA]nT_{1w}} \quad (1)$$

wherein:
$M_s$ and $M_o^*$ are the water proton signal intensities for on-resonance and symmetrical off-resonance irradiation (at $+\Delta\omega_{CA}$ and $-\Delta\omega_{CA}$) respectively,
$k_{CA}$ is the exchange rate constant for one chemical exchangeable entity, e.g. exchangeable proton,
[CA] is the contrast agent molecule concentration,
n is the number of chemical exchangeable entities, e.g. exchangeable protons, per molecule,
and $T_{1w}$ is the longitudinal relaxation time constant of the water protons.

This relation follows from the modified Bloch equations and is valid under the condition that the exchangeable entities, e.g. exchangeable protons, have to be completely saturated by the RF pulse.

In the case of two exchangeable proton pools on the same contrast agent, equation (1) can be rewritten for both pools as equations (2) and (3):

$$\left(\frac{M_0^* - M_s}{M_s}\right)^{pool1} = k_{CA}^{pool1}[CA]n^{pool1}T_{1w} \quad (2)$$

$$\left(\frac{M_0^* - M_s}{M_s}\right)^{pool2} = k_{CA}^{pool2}[CA]n^{pool2}T_{1w} \quad (3)$$

The ratio of these two equations reduces to equation (4):

$$\frac{\left(\frac{M_0^* - M_s}{M_s}\right)^{pool1}}{\left(\frac{M_0^* - M_s}{M_s}\right)^{pool2}} = \frac{k_{CA}^{pool1}n^{pool1}}{k_{CA}^{pool2}n^{pool2}} \quad (4)$$

wherein $n^{poolx}$ is determined by the contrast agent used and $k_{CA}^{poolx}$ is a function of the pH. When $k_{CA}^{pool1}$ and $k_{CA}^{pool2}$ have a different dependence on pH, ($k_{CA}^{pool1} n^{pool1}$)/($k_{CA}^{pool2} n^{pool2}$) will also vary with pH.

Thus, by sequentially acquiring images using pre-saturation pulses at on-resonance and symmetrical off-resonance frequencies for both pool 1 and pool 2, the concentration dependence can be eliminated. Moreover, in that way, also possible variations in $T_{1W}$ may be eliminated.

This 'ratiometric method' has been applied to diamagnetic contrast agents as in WO 00/66180, and later on to contrast agents comprising paramagnetic contrast ions (EP1 331 012).

A problem that has not been solved until now is that elimination of dependency on the CEST contrast agent concentration can only be obtained by using two different proton pools.

This has some disadvantages. Indeed, selecting a single CEST agent or a mixture of two CEST agents presenting two suitable exchangeable proton pools with very different pH dependence of the exchange is difficult in practice because the number of types of exchangeable and for CEST suitable entities is limited. Most used exchangeable entities are amide protons and bound water. Moreover, the difference in pH dependence must be in the range which is clinically relevant for the desired application, preferably between pH 6.5 and pH 7.5.

Further, in the case of two separate CEST agents, equal bio-distribution of the two molecules has to be assumed. Finally, to have two different exchangeable proton pools will always lead to a non-optimized maximum CEST effect because of a non-maximum concentration of exchangeable protons, since they have to be divided over the two pools.

It is an object of the present invention to provide a method for eliminating the contrast agent concentration dependency in mapping of a physico-chemical parameter, such as pH, $pO_2$, temperature or metabolite concentration, using CEST magnetic resonance imaging without two exchangeable proton pools necessarily being present in the CEST contrast agent.

The above objective is accomplished by a method according to the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

The following terms are provided solely to aid in the understanding of the invention. These definitions should not be construed to have a scope less than understood by a person of ordinary skill in the art.

Chemical Exchange Saturation Transfer (CEST): refers to all saturation transfer processes that are dependent on chemical exchange between two molecules which exhibit different magnetic resonance frequencies.

CEST effect: extent of the decrease of the signal used to generate the MR image, caused by CEST, e.g. the water proton signal decrease in the case of proton imaging. The CEST effect can be written as $1-M_S/M_0^*$, wherein $M_S$ is the intensity of that signal upon pre-saturation of the exchangeable entities, e.g. protons, and $M_0^*$ is the intensity of that signal upon irradiating at an off-resonance frequency, preferably at the opposite side of the frequency spectrum relative to that signal (symmetrical off-resonance).

CEST spectrum: the intensity of the signal used to generate the MR image, caused by CEST, e.g. the intensity of the water proton signal in the case of proton imaging, as a function of pre-saturation frequency offset.

CEST Contrast agent (CA): material having at least one exchangeable entity, e.g. exchangeable proton, that can chemically exchange for exchangeable entities of another material, and which can be used to perform CEST imaging. The exchangeable entity, e.g. proton, may or may not be incorporated in an exchangeable molecule or group of atoms, e.g. a water molecule.

Exchangeable entity pool: the whole of all exchangeable entities, e.g. exchangeable protons, which on the one hand chemically exchange with other exchangeable entities, e.g. protons, and on the other hand are chemically and magnetically equivalent under conditions relevant to the method according to the present invention. A specific example of an exchangeable entity pool may be an exchangeable proton pool.

Water proton signal: The signal in the proton NMR spectrum caused by the resonance of the protons of free water, the signal having a frequency and an intensity.

Magnetic resonance imaging (MRI): Imaging technique where nuclear magnetic resonance is used to construct an image of a subject in order to obtain medical information.

Resonance Frequency: Frequency at which a nuclear spin resonates.

Proton Resonance Frequency: Frequency at which the nuclear spin of the proton resonates.

Saturation Frequency: Frequency at which a saturation RF pulse is applied.

The present invention provides a method of providing an MRI image of at least a part of a body of an individual to who an amount of a CEST contrast agent having exchangeable entities forming at least one exchangeable entity for exchanging with exchangeable entities of a main exchangeable entity pool naturally present in at least a part of the body of the individual, has been administered. The method comprises:

defining a range of interest of a physico-chemical parameter between a first, lower parameter value and a second, higher parameter value, irradiating the CEST contrast agent with pre-saturation RF pulses having a first pre-saturation frequency for saturating exchangeable entities of a first exchangeable entity pool, and recording a corresponding first image, using the main naturally present exchangeable entity pool, irradiating the CEST contrast agent with pre-saturation RF pulses having a second pre-saturation frequency for saturating exchangeable entities of the first exchangeable entity pool, the second pre-saturation frequency being different from the first pre-saturation frequency, and recording a corresponding second image, using the main naturally present exchangeable entity pool, determining the ratio of $(M_o^*-M_s)/M_s$ for the two pre-saturation frequencies for at least a part of the image, comparing the $(M_o^*-M_s)/M_s$ ratio values with a standard curve in order to determine the value of the physico-chemical parameter, with Ms and $M_0^*$ intensities of the signal used to generate the MR image for on-resonance and symmetrical off-resonance irradiation of the CEST contrast agent respectively, wherein the first and the second frequencies are selected such that they are both capable of at least partly pre-saturating a same exchangeable entity pool at at least one value within the defined range of interest of the physico-chemical parameter.

In embodiments of the invention and in case of proton imaging, the signal used to generate the MR image caused by CEST may be a water proton signal.

An advantage of the present invention is that a CEST contrast agent having only one exchangeable entity pool may be used in order to eliminate the dependency of the MRI results on the contrast agent concentration. Even if the contrast agent comprises more than one exchangeable entity pool, only one exchangeable entity pool has to be used according to the method of the present invention for eliminating the concentration dependence.

The first and second frequencies are both on-resonance pre-saturation frequencies. Imaging using CEST contrast agents furthermore also makes use of off-resonance pre-saturation frequencies. On-resonance pre-saturation frequency may be defined as the frequency at which the exchangeable entity can be saturated at at least one value of the physico-chemical parameter lying in the range of interest. It has to be mentioned that the frequency shifts with the physico-chemical parameter.

An advantage of the method according to the invention is that it can in principle be applied to any CEST agent with an entity exchange, e.g. proton exchange, which is dependent on a physico-chemical parameter, e.g. which is pH-dependent, because the resonance frequency will always shift towards the resonance frequency of the signal used to generate the MR image, caused by CEST, e.g. the water proton resonance frequency in case of proton imaging, at higher exchange rate.

Another advantage is that there cannot be any uncertainty about differences in local concentration of two exchangeable entity pools, e.g. two exchangeable proton pools.

A further advantage is that the CEST effect can be better optimized i.e. the concentration of exchangeable entities, e.g. protons, can be maximized.

The method according to the invention is based on the observation that generally the CEST effect reaches a maximum at a certain physico-chemical parameter value, e.g. pH value, and decreases again at higher physico-chemical parameter values, e.g. pH values. The decrease is due to the fact that pre-saturation of the exchangeable entities, e.g. protons, is hampered because the resonance of the exchangeable entity, e.g. proton resonance, gets broader and shifts towards the water peak at higher exchange rates, i.e. the exchangeable entities, e.g. protons, are not completely saturated anymore.

According to the invention, it has been found that due to this shift two different pre-saturation frequencies can be chosen with very different physico-chemical parameter dependence, e.g. pH or temperature dependence, of the CEST effect: frequency 1 corresponding to the resonance of the exchangeable entity, e.g. proton resonance, at the value for the physico-chemical parameter, e.g. pH, at which no or slow exchange takes place, and frequency 2 closer to the water proton signal. The value of the physico-chemical parameter at which there is no or slow exchange is at the low end of the range of possible values of the physico-chemical parameter in case said physico-chemical parameter is pH or temperature.

The choice of frequency 2 is governed by three conditions:
the dependence on the physico-chemical parameter, e.g. pH dependence, of the CEST effect should be as different as possible relative to CEST at frequency 1;
the CEST effect (particularly at the high limit of the defined range of interest of the physico-chemical parameter in case of pH or temperature) should be as high as possible; and
direct bulk water proton saturation should be prevented as much as possible.

In order to fulfill condition 1, frequency 2 should be far from frequency 1, whereas for conditions 2 and 3 frequency 2 should be not too close to the resonance frequency of the main naturally present pool, i.e. the pool that is used to generate the MR image, e.g. water proton resonance frequency in case of proton imaging. Therefore, frequency 2 may be chosen intermediate between frequency 1 and the signal used to generate the MR image, caused by CEST, e.g. the water proton signal in case of proton imaging. In other words, frequency 1 and frequency 2 should be such that they are both capable of at least partly pre-saturating the same exchangeable entity pool, e.g. exchangeable proton pool, at at least one value within the defined range of interest of the physico-chemical parameter.

When the conditions described above are sufficiently met, i.e. when the first and the second pre-saturation frequency (frequency 1 and frequency 2 respectively) are chosen properly, the concentration dependence can be eliminated.

This can be described by the following equations (5) and (6)

$$\left(\frac{M_0^* - M_s}{M_s}\right)^{freq1} = k_{CA}[CA]nT_{1w}X^{freq1} \quad (5)$$

$$\left(\frac{M_0^* - M_s}{M_s}\right)^{freq2} = k_{CA}[CA]nT_{1w}X^{freq2} \quad (6)$$

wherein $X^{freqx}$ represents the fraction of pre-saturation of the exchangeable entities, e.g. protons, by the RF pulse, which depends on the physico-chemical parameter value, e.g. pH, and not on the contrast agent concentration. The physico-chemical parameter value dependencies, e.g. pH dependencies, are different for the two frequencies.

The ratio of these two equations reduces to equation (7):

$$\frac{\left(\frac{M_0^* - M_s}{M_s}\right)^{freq2}}{\left(\frac{M_0^* - M_s}{M_s}\right)^{freq1}} = \frac{X^{freq2}}{X^{freq1}} \quad (7)$$

The exchangeable entities forming at least one exchangeable entity pool may, for example, be protons, water molecules or phosphate groups. However, the method may be applied on all particles comprising a measurable spin magnetic moment. MRI may also be performed on particles with measurable spin magnetic moment that are naturally present in the body of an individual, other than protons. In that case, the use of a CEST contrast agent with exchangeable entities having a measurable spin magnetic moment and forming at least one entity pool is disclosed, wherein exchange takes place between the CEST contrast agent and the main naturally present pool in the body, with a difference in resonance frequency between the two pools. An example of a particle with measurable spin magnetic moment other than a proton and naturally present in the body of an individual may be a phosphorous atom. An example of an exchangeable entity containing a phosphorous atom, so that it may be used for CEST with phosphorous NMR, may be a phosphate group.

According to the invention, the physico-chemical parameter may be pH, temperature, $pO_2$ or metabolite concentration.

In one embodiment, the contrast agent may have exchangeable entities having a resonance frequency, wherein the first frequency corresponds to the resonance frequency at the first parameter value at which the entity exchange is very slow, i.e. in which the product of resonance frequency difference $\Delta\omega$ (in rad/s) and exchangeable entity lifetime (in s) is larger than 10.

In embodiments according to the invention, the second frequency may be comprised between the resonance frequency of the exchangeable entity at the first parameter value and the resonance frequency of the main naturally present pool, i.e. the pool that is used to generate the image, e.g. water proton resonance frequency in case of proton imaging.

According to embodiments of the invention, the CEST contrast agent may comprise at least one paramagnetic ion. In some embodiments, the CEST contrast agent may comprise multiple paramagnetic ions.

According to an embodiment of the invention, the CEST contrast agent may comprise a carrier, such as a dendrimer, a linear polymer, a liposome or a particle such as a micelle, or any other particle having a phospholipid or polymeric shell or core, and complexes comprising a chelating agent and a paramagnetic ion.

In a specific example, the CEST contrast agent may comprise a PPI dendrimer as a carrier and Yb-DOTAM complexes covalently attached to the PPI dendrimer. In this case, the first frequency may be =2000 Hz and the second frequency may be −1000 Hz relative to the resonance frequency of the main naturally present pool, i.e. the pool that is used to generate the MR image, e.g. water proton resonance frequency in case of proton imaging.

In embodiments according to the invention, the CEST contrast agent may comprise a single exchangeable entity pool.

In embodiments of the invention, the at least one exchangeable entity pool may be at least one proton pool and the main naturally present exchangeable entity pool may be a free water proton pool. In further embodiments, the CEST contrast agent may comprise a single proton pool.

The present invention furthermore provides a computer program product which, when executed on a processing device, performs the method as provided by the present invention.

Furthermore, the invention provides a machine-readable data storage device storing the computer program product of the present invention.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

A suitable CEST contrast agent with adjustable contrast which may be used with a method of the present invention may be a molecule which comprises a carrier with at least one (super)paramagnetic particle/ion and hydrogen atoms or protons, which can undergo chemical exchange with the main water pool in the human body. Preferably, the contrast agent may comprise multiple paramagnetic ions per particle/molecule. This provides a very high number, i.e. >100, of exchangeable entities, e.g. protons, with a resonance frequency well away from the resonance frequency of the main naturally present pool, i.e. the pool that is used to generate the image, e.g. the water proton resonance in case of proton imaging. Preferably, lanthanide salts may be used because it is known that chemical shifts of protons that are situated close to a paramagnetic ion can be very large. Most preferred, ytterbium (Yb) salts may be used as lanthanide salt. Preferred candidates for groups with exchangeable hydrogen atoms are amides but other groups may also be possible, for example amines, imines, urea, imides, bound water molecules, phosphates, alcohols, aldehydes, ketones, carboxylic acids, phenols and thiols. The range of proton exchangeable groups may be very large and may, for example, furthermore comprise boron, carbon, nitrogen, oxygen, silicon, phosphor, sulphur atoms. As an alternative to lanthanide ions, all other paramagnetic ions, such as e.g. transition metal ions, or clusters of paramagnetic ions forming (super)paramagnetic particles, e.g. superparamagnetic iron oxide particles coated with dextran or a polymer containing amide protons, may also be used.

Figure 1A:
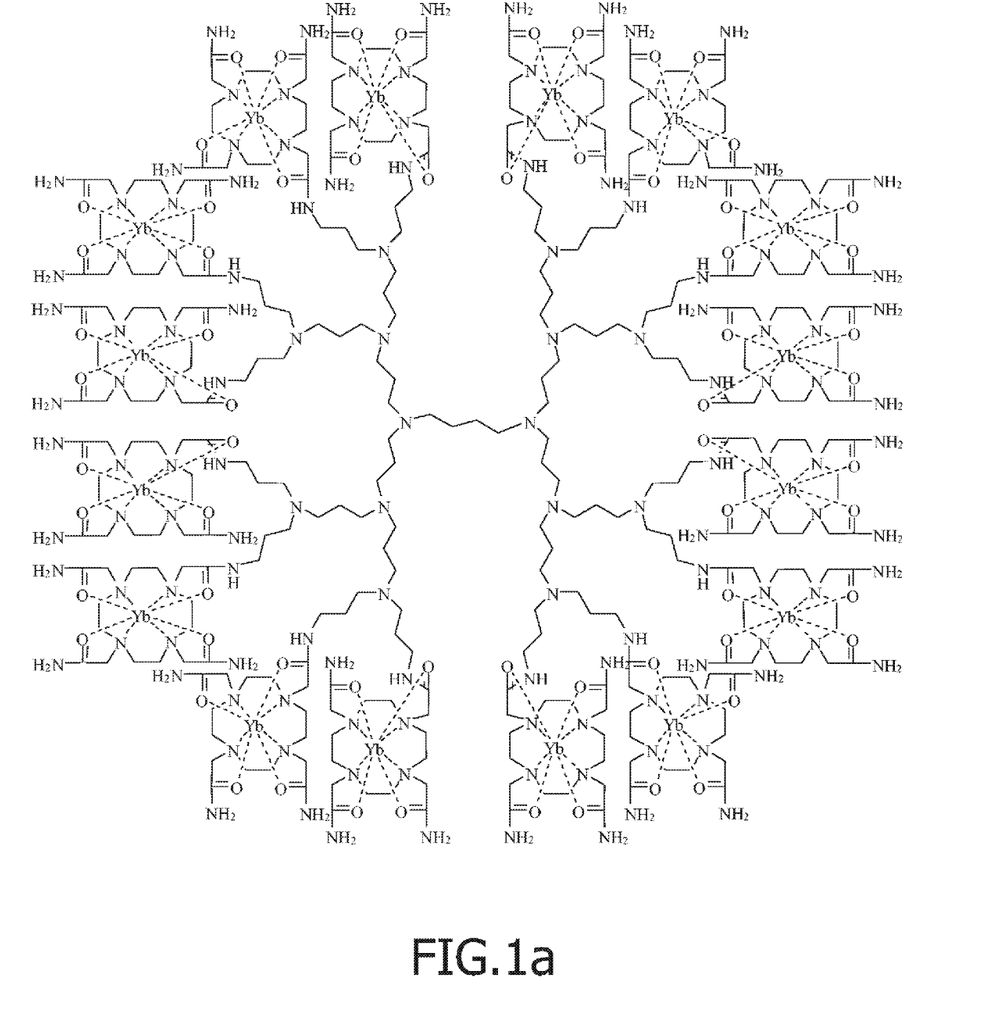
FIG. 1a represents the chemical formula of Yb-DOTAM-G3, a CEST contrast agent which has been used in an embodiment of the method according to the invention.

A CEST contrast agent which may in particular be used in embodiments of the method according to the present invention, is represented in FIG. 1a, and is a poly(propylene imine) PPI generation 3 dendrimer (also called DAB-Am-16) with Yb-DOTAM complexes attached to the 16 end groups of the dendrimer (DOTAM=1,4,7,10-tetraazacyclododecane-1,4,7,10-tetraacetamide). This CEST contrast agent is called 'Yb-DOTAM-G3' in the remaining part of the present text. In FIG. 1a, every 'Yb' represents $Yb^{3+}$, and has a water molecule at the ninth coordination site, which is omitted for clarity.

Figure 2:
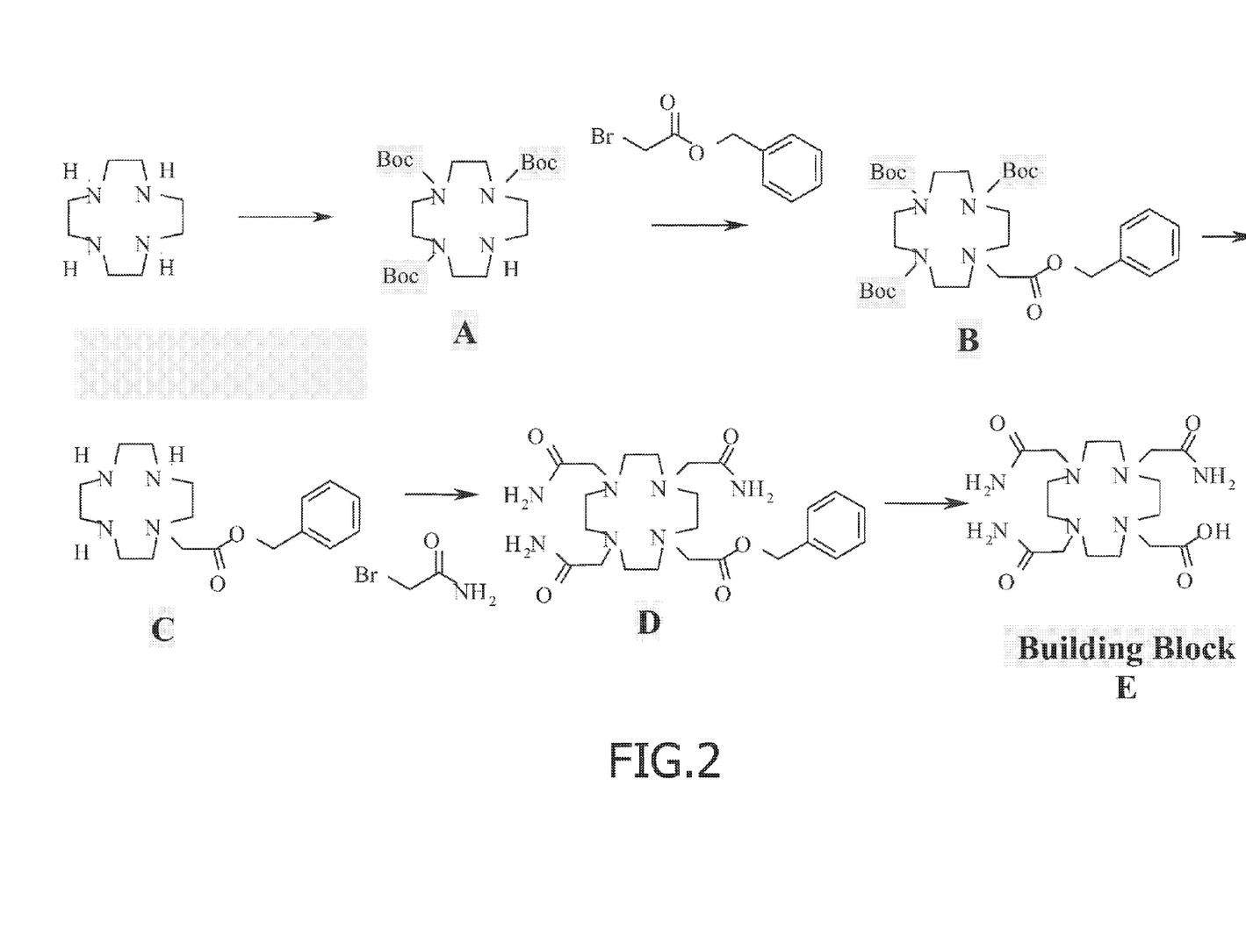
FIG. 2 and FIG. 3 illustrate the synthesis of Yb-DOTAM-G3.

For the synthesis of Yb-DOTAM-G3, an asymmetric DOTAM derivative was synthesized and coupled to the 16 end groups of a PPI dendrimer of generation 3. Yb complexes were obtained by adding an aqueous solution of $YbCl_3$ and subsequent dialysis. This will be described in more detail hereinafter. The synthesis of the 'building block' or paramagnetic complex is illustrated in FIG. 2. The synthesis is started from cyclen, which is a commercially available compound e.g. from Aldrich or Macrocyclics. The molecules A, B and C in FIG. 2 are known from literature. Molecule A and its synthesis have been reported in a.o. "E. Kimura, J. Am. Chem. Soc., 1997, 199, 3068-3076". Molecule B has been reported in WO 2004065385, Molecule C has been reported in "A. Heppeler et al., Chem. Eur. J. 1999, 5, 7, 1974-1981".

Molecule A can be prepared by slowly, i.e. within 3 hours, adding a solution of di-tert-butyl dicarbonate (7.9 g, 36 mmol) in $CHCl_3$ (100 mL, passed through $Al_2O_3$) to a solution of cyclen (2.2 g, 13 mmol) and triethylamine (5.5 mL, 39 mmol) in $CHCl_3$ (120 mL) at room temperature. The reaction mixture is stirred for 24 hours at room temperature, and the organic solvent is removed under reduced pressure. The remaining residue is purified by silica gel column chromatography (hexanes/AcOEt) to provide molecule A as a colorless, amorphous solid (4.4 g, 72%)[E. Kimura, J. Am. Chem. Soc., 1997, 199, 3068-3076].

The tri-BOC protected molecule A (15.2 g) is then dissolved in 20 mL of acetonitrile, after which 19 mL of diisopropylethylamine and 7.9 g of benzylbromoacetate in 10 mL acetonitrile are added. The solution is heated up to 60-65° C. and stirred overnight under an argon atmosphere. The mixture is then concentrated by evaporation of the solvent and dissolved in dichloromethane. The solution is washed with 1 M NaOH. The organic layer is dried with $Na_2SO_4$ and thereafter reduced by evaporation and co-evaporation with toluene. The pure product, molecule B, is isolated by silica column chromatography using hexane/ethyl acetate(1/1) as eluent. The yield is about 90%.

Molecule B (6.22 g) is dissolved in 60 mL dichloromethane and 60 mL trifluoracetic acid (TFA). The solution is stirred under a nitrogen atmosphere. After 3 hours the solvents are evaporated and another portion of TFA (40 mL) is added. After 2 hours of further stirring the TFA is evaporated and the remaining mixture is co-evaporated twice with toluene, leaving the crude TFA-salt of molecule C as an oil, of which then 10 g is used in a following step without further purification. The oil is dissolved and stirred in 45 mL DMF and 31 mL diisopropylethylamine. Then, 4.7 g bromo acetamide is added and the mixture is stirred for two days at 50° C., during which time a precipitate is developed. The mixture is brought in 600 mL ether, is stirred and the brown precipitate is isolated by filtration and washing with ether. The solid is then washed four times with portions of 25 mL of 25% $NH_3$ solutions in water and finally with 30 mL of water. Drying under vacuum at 40° C. results in a white solid product of molecule D (yield=85%).

Molecule D (1.7 g) is then hydrogenated at 70 psi overpressure in 100 mL water using Pd/C (10%) as catalyst. The mixture is filtered over celite, the celite is washed with some water and the filtrate is freeze dried and then dried over $P_2O_5$ in vacuum to afford 1.1 gram of a fine white hygroscopic powder of molecule E.

Figure 3:
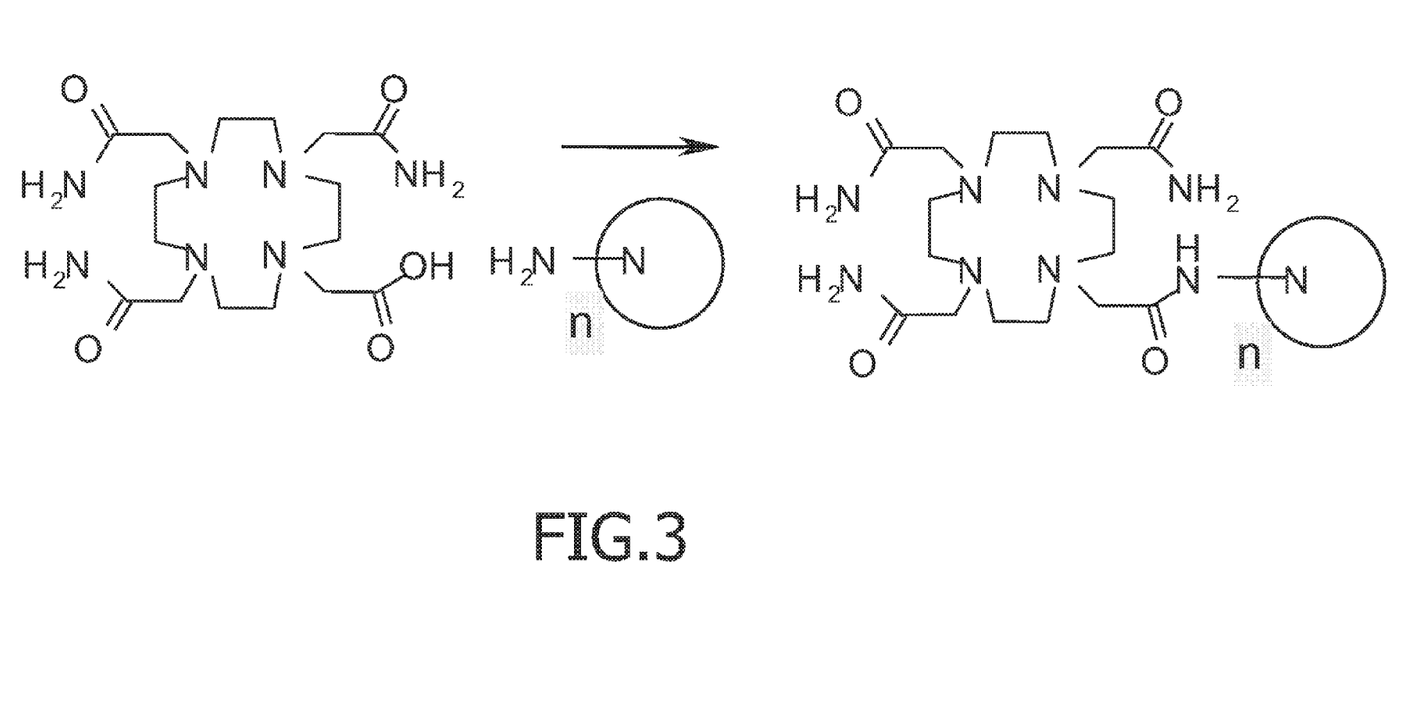

For the coupling of molecule E to the carrier, in the example given to a PPI dendrimer, the amide coupling agent HBTU (O-(benzotriazol-1-yl)-N,N,N',N'-tetramethyluronium hexafluorophosphate) is used. The coupling of the paramagnetic complex to the dendrimer is illustrated in FIG. 3. For convenience, the dendrimers are denoted as circles. The dendrimers used are commercially available poly(propylene imine) (PPI) dendrimers (from Aldrich under the name DAB-Am-X or from SyMO-Chem) with a diaminobutane (DAB) derived core. The most used name for those dendrimers is DAB-Am-X, wherein X refers to the number of surface amino groups. In this synthesis, DAB-Am-16 has been used in order to obtain a DOTAM-G3 complex.

For the coupling of molecule E to the G3 PPI dendrimer, 0.25 mL diisopropylethylamine is added to a mixture of 164 mg HBTU in 1 mL dry DMF. Molecule E (172 mg) is added and the mixture is stirred until a clear solution is acquired. This may take about 5 to 10 minutes. The third generation PPI-dendrimer DAB-Am-16 (41 mg) in 1 mL dry DMF is then added and the solution is stirred overnight under an inert atmosphere of nitrogen. The mixture is poured into 40 mL of stirred ether giving a precipitate; the ether is replaced by another portion of ether (washing step), and the precipitate is dried. Finally, the precipitate is dissolved in water and triethylamine and this solution is dialyzed using a membrane with a molecular weight cut-off of 1000 and using 1.2 L of water and 20 mL of triethyl amine as washing solvent. After overnight dialysis, the washing solution is replaced by 1.2 L of water and dialysis is continued for another 24 hours. Freeze drying of the solution in the dialysis tube gave ca. 200 mg of a fluffy white product, which in the further synthesis will be called molecule II.

A last step in the synthesis is the complexation with $Yb^{3+}$ ions. For the formation of the Yb-DOTAM-G3 complex a solution of 0.1 mmol $YbCl_3$ in 5 mL water is added dropwise to a stirring solution of 49 mg (0.1 mmol) of molecule II in 8 mL water. Subsequently, the solution is heated up to 60° C. for 2 hours while stirring, meanwhile maintaining a pH of 7 to 8 by adding small drops of $NH_4OH$. The solution is dialyzed for 24 hours using a membrane with a molecular weight cut-off of 500 and running water as washing solvent. Freeze drying of the solution yields a white powder in a yield of ~80%. The resulting Yb-DOTAM-G3 complex is illustrated in FIG. 1a.

Instead of a dendrimer as a carrier, as in the previous examples, a linear polymer, e.g. polyethylene imine, polyarginine, polyasparagine, polylysine or polyglutamine, or a liposome or a (lipid) micelle or any particle with a phospholipid or polymeric shell or core, e.g. phospholipid particles as described in US 2004/0058951, may be used as a carrier. The latter may have the advantage that more paramagnetic ions may be incorporated in one particle, which may improve the sensitivity even more.

Figure 1B:
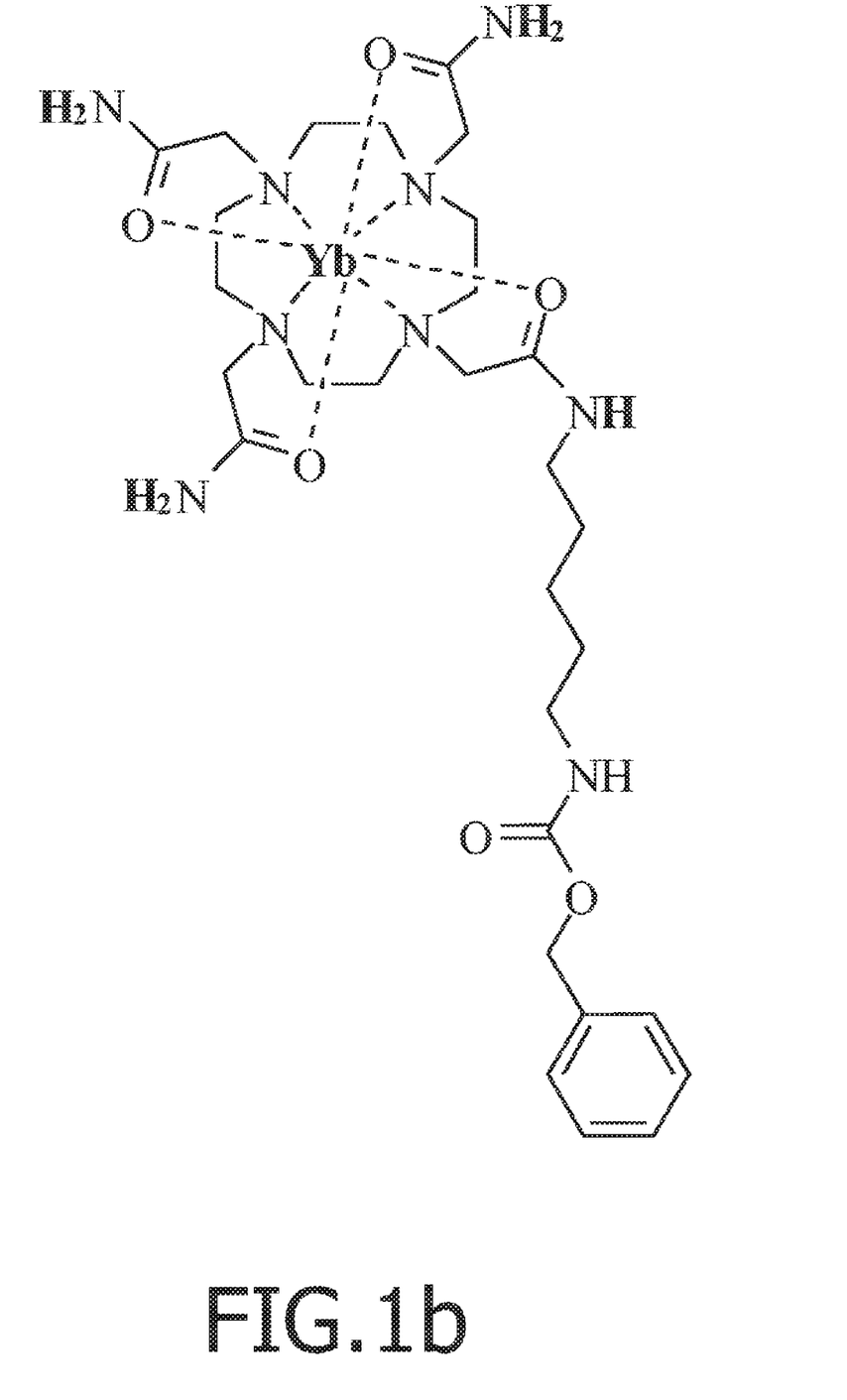
FIG. 1b represents the chemical formula of a Yb-DOTAM-tail, for the sake of comparison.

In FIG. 1b, the chemical formula of a Yb-DOTAM-tail or {5-[ytterbium-2-(4,7,10-tris-acetamido-1,4,7,10-tetraazacyclododecyl-acetylamido]-pentyl}-carbamic acid benzyl ester is illustrated. This Yb-DOTAM-tail will in the further description only be used for comparison reasons.

One of the main applications of the method according to the first aspect of the invention may be in the area of molecular imaging. To obtain sufficient sensitivity, preferably CEST agents with multiple paramagnetic ions per particle/molecule may be used, because they provide a very high number of exchangeable entities, e.g. protons, with a resonance frequency well away from the resonance frequency of the main naturally present pool, i.e. the pool that is used to generate the image, e.g. the water proton resonance frequency in case of proton imaging. The multiple paramagnetic ions can be attached covalently or non-covalently to a carrier, which can be e.g. a dendrimer, a linear polymer or a liposome.

It has, however, to be understood that other agents than the CEST agents described above may also be used to obtain the benefits of this invention.

Figure 4:
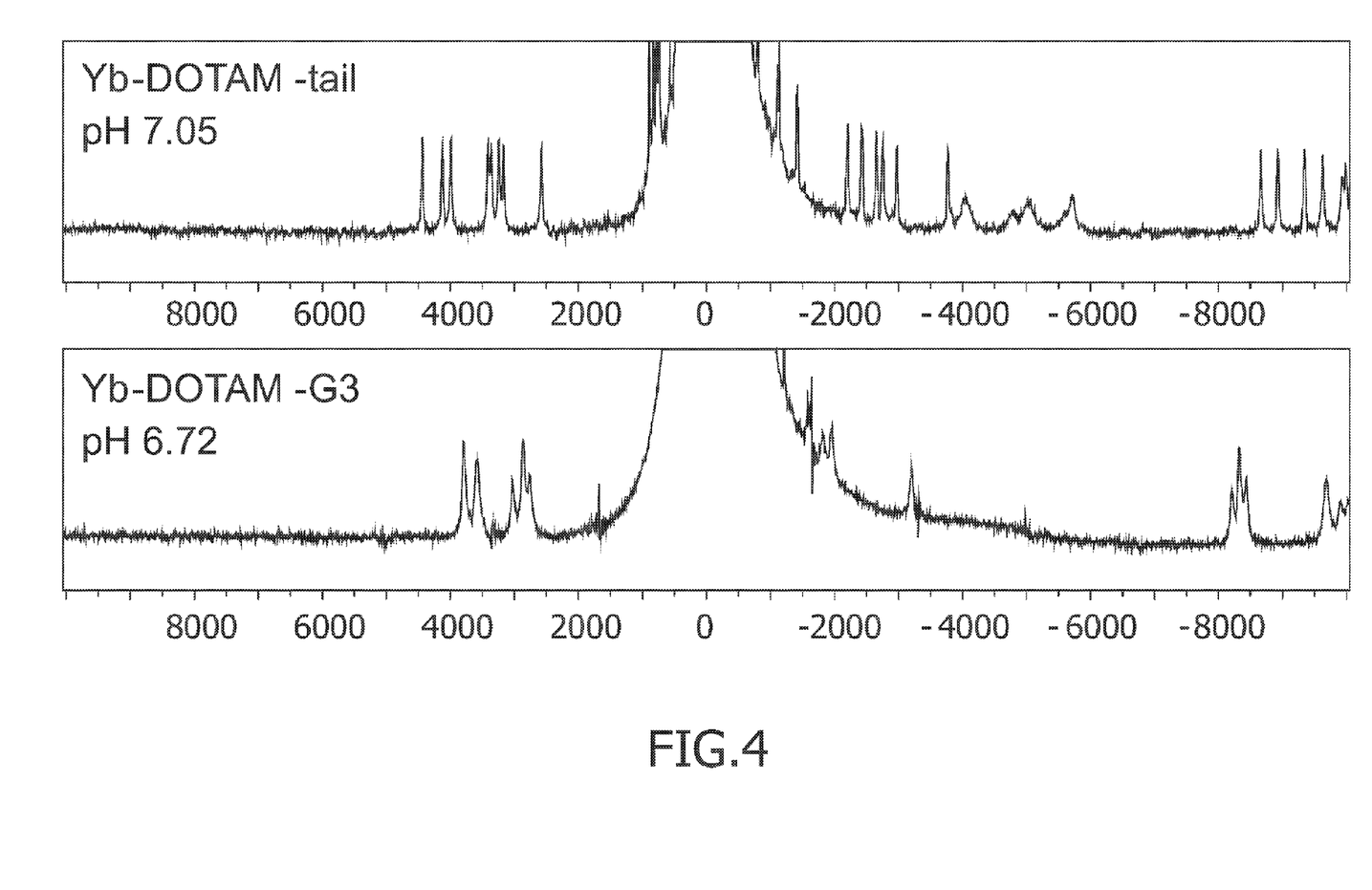
FIG. 4 represents the $^1$H-NMR spectrum for Yb-DOTAM-tail (top figure) and Yb-DOTAM-G3 (bottom figure), in water.

FIG. 4 represents a $^1$H-NMR spectrum for Yb-DOTAM-tail (top figure) and for Yb-DOTAM-G3 (bottom figure) in water, recorded on a Bruker 7T NMR spectrometer, with the water proton resonance set at 0 Hz. Yb-DOTAM has exchangeable amide protons around −16 ppm with respect to the water resonance, as shown in FIG. 4. In the Yb-DOTAM-tail spectrum (top figure), the broader peaks around −5000 Hz are attributed to the different amide protons. They are broadened by moderate proton exchange. The amide proton resonance for Yb-DOTAM-G3 (bottom figure) is a broad band already shifted towards the water peak (around −4000 Hz). The 7 different amide protons cannot be distinguished at this pH, i.e. they are magnetically equivalent, because of the fast exchange. They can thus be considered one proton pool. The spectra shown in FIG. 4 were recorded with a Bruker 7T NMR spectrometer. It has to be noted that the values of −5000 Hz and −4000 Hz in the frequency scale measured at 7T correspond to about respectively −1700 Hz and −2100 Hz at 3T (see further).

Figure 5:
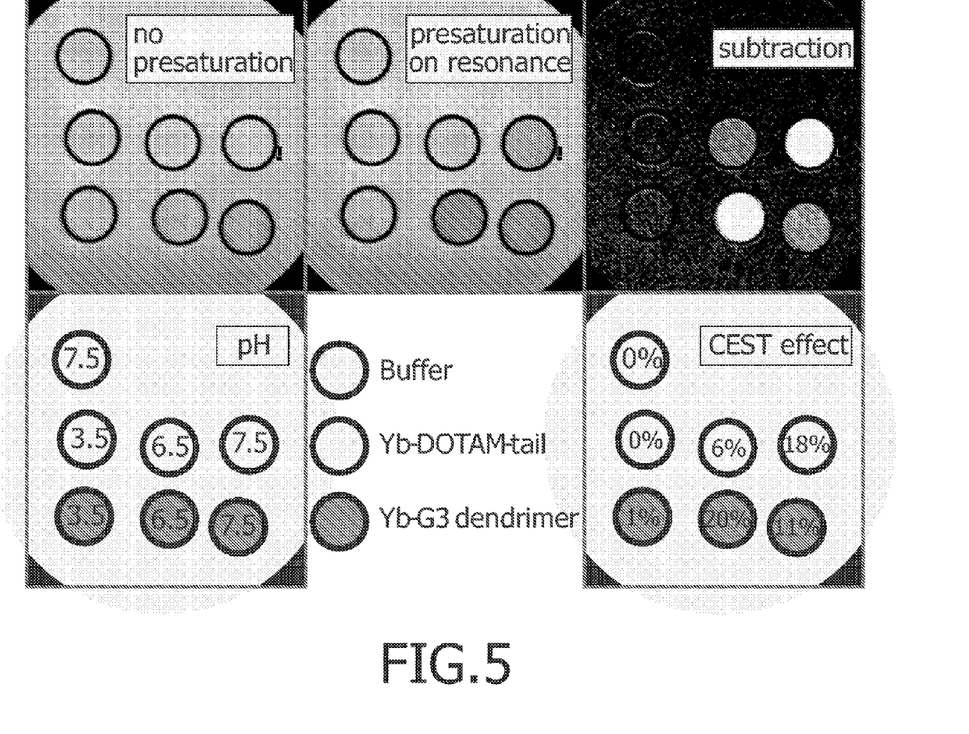
FIG. 5 represents TSE Proton Density Weighted images of a phantom comprising vials with solutions of Yb-DOTAM-G3 (0.9 mM, lower row) and Yb-DOTAM-tail (14 mM, middle row) with MOPS buffer in water, at various pH; the top vial only comprises MOPS buffer in water.

FIG. 5 shows the results of imaging experiments carried out on a Philips 3T human MRI scanner. Vials with solutions of Yb-DOTAM-tail and Yb-DOTAM-G3 at 3 different pH values were placed in a beaker with physiological water. The Yb concentration was the same in all vials. Proton Density Weighted images with and without applying a pre-saturation pulse were acquired of a slice through the vials containing the solutions with contrast agent. The frequency of the pre-saturation pulse was −1900 Hz relative to the water proton resonance frequency. The pre-saturation pulse was in fact a train of 16 sinc-gauss pulses of 50 ms with a flip-angle of 2500° per pulse. The acquisition parameters were: TE 15 ms, TR 8 s, TSE 20. The aim in this experiment is to obtain contrast due to CEST. Indeed, the image without pre-saturation, (FIG. 5 top left) shows hardly any intensity differences. Upon pre-saturation of the amide protons at −1900 Hz the intensity $M_s$ of the four most right vials is lower due to the occurrence of CEST (top middle). This can more clearly be seen in the top right image, which is the difference between the other two. The maximum CEST effect is in this case 20%. For Yb-DOTAM-G3 at pH 7.5 the CEST effect is 11%, which is half of the value at pH 6.5 due to the shift of the amide proton resonance (see above). For Yb-DOTAM-tail the maximum CEST effect is obtained at pH 7.5. The maximum CEST effect for Yb-DOTAM-G3 is obtained at a lower pH due to the basic dendritic core.

A CEST spectrum represents the relative intensity of the signal used to generate the MR image caused by CEST, e.g. water proton signal in case of proton imaging, as a function of the pre-saturation frequency (expressed in Hz) The protocol for obtaining such a CEST spectrum may comprise: acquiring an image as the image in the middle top figure in FIG. 5 using a certain pre-saturation frequency, integrating the intensities of all pixels for the three vials with Yb-DOTAM-G3 and repeating this procedure for all pre-saturation frequencies.

Figure 6:
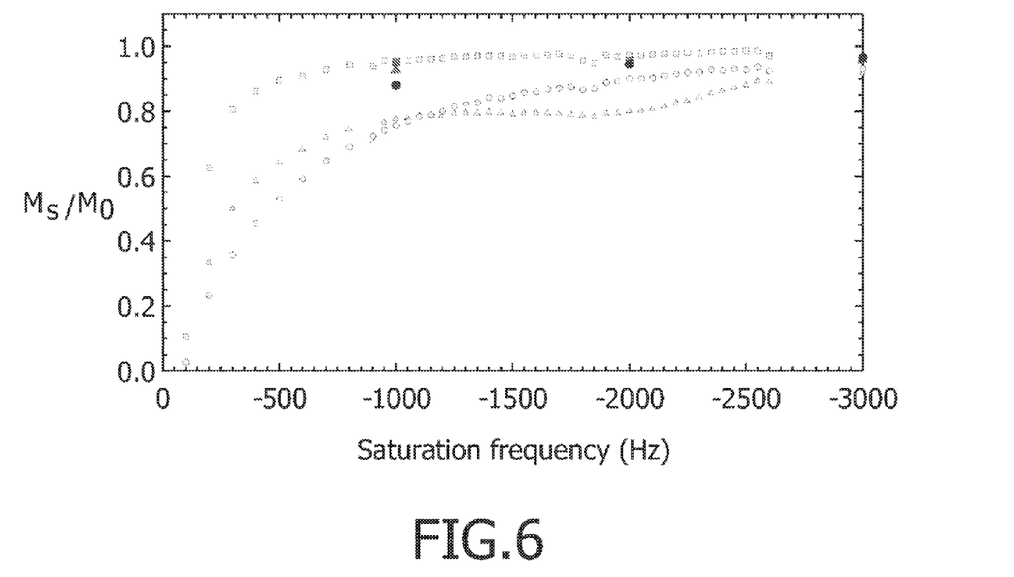
FIG. 6 represents CEST spectra for Yb-DOTAM-G3, at various pH, and for various irradiation frequencies.

FIG. 6 represents the CEST spectra for Yb-DOTAM-G3 (0.9 mM) with MOPS buffer in water at various pH, namely 3.5 (white square), 6.5 (white triangle) and 7.5 (white circle) and at 298K. The filled symbols are measured points at positive irradiation frequencies (+1000 Hz, +2000 Hz and +3000 Hz), which have been plotted in the negative part of the spectrum for the sake of comparison. The frequency of the pre-saturation pulse was varied, for every frequency an image such as the middle image in the top row of FIG. 3 was acquired and the intensities $M_s$ were measured by integration of all image pixels within a specific vial. This resulted in the CEST spectra in FIG. 6, where the intensities with pre-saturation, $M_s$, divided by the intensities without pre-saturation, $M_s$, are plotted as a function of the pre-saturation frequency. Particularly in the curve for pH 6.5, a minimum can be seen around −2000 Hz indicative of CEST mediated by the amide protons.

It can be seen from FIG. 6 that $M_s/M_s$ decreases strongly when the pre-saturation frequency approaches 0 Hz. This is due to the direct water saturation. Although the center of the water peak is at 0 Hz, it is a band that can also be saturated directly at frequencies other than 0 Hz, even slightly at −2000 Hz. This contributes to the decrease of the water proton signal, but is not due to CEST. To correct for this, a control irradiation must be performed symmetrically at the other side of the water proton signal. This signal decrease that is measured then is due to direct water saturation. To eliminate effects from direct water pre-saturation, in the example given, a control irradiation was performed at +1000, +2000 and +3000 Hz (filled symbols in FIG. 6). By comparing the open (CEST+direct water pre-saturation) and filled (direct water pre-saturation) symbols in FIG. 6 it can be seen that even at −1000 Hz, CEST takes place for pH=6.5 and pH=7.5.

More vials with Yb-DOTAM-G3 with different pH values were tested. Images were acquired with pre-saturation at ±1000 Hz and ±2000 Hz. By this way the CEST effect i.e. $1-M_s/M_o*$ as a function of pH could be calculated for Yb-DOTAM-G3 for pre-saturation at −1000 and −2000 Hz, see FIG. 7.

Figure 7:
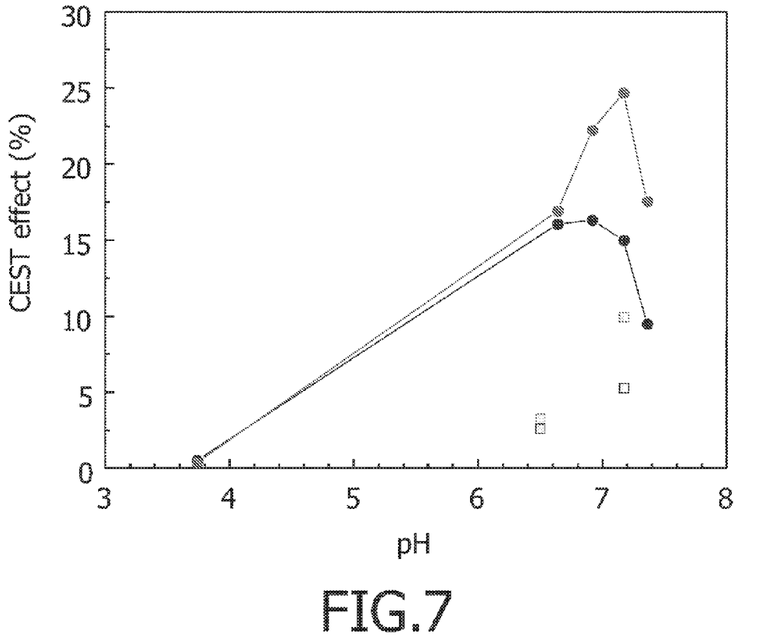
FIG. 7 is a graph representing the measurement of the CEST effect against pH for Yb-DOTAM-G3 at two different irradiation frequencies.
Figure 8:
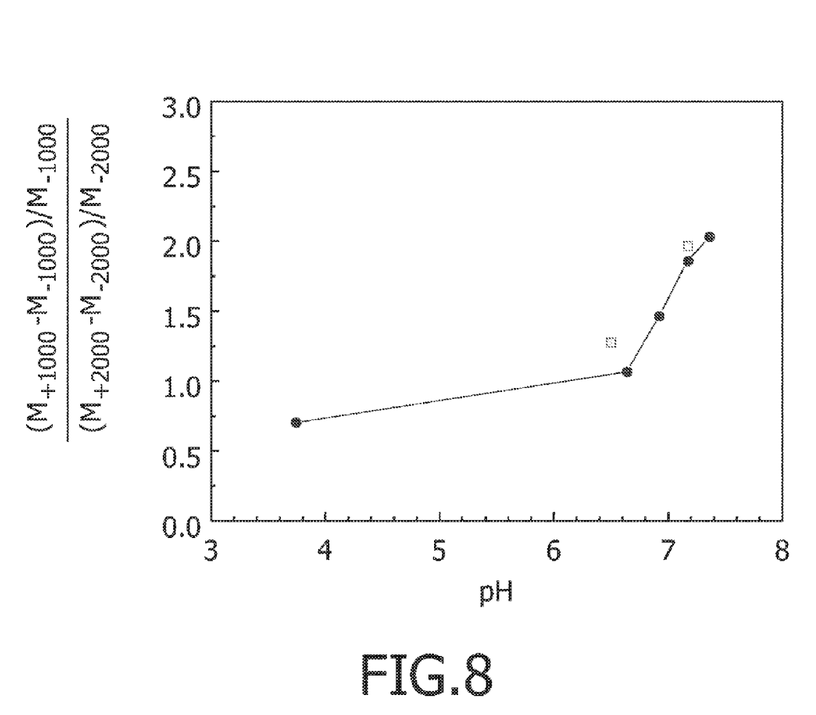
FIG. 8 is a graph representing $\{(M_o{*}-M_s)/M_s\}^{-1000}/\{(M_o-M_s)/M_s\}^{-2000}$ against pH for Yb-DOTAM-G3.

In FIG. 7 and FIG. 8, the filled-in circles represent the CEST effect for CEST contrast agent concentrations of 0.9 mM where the upper curve is for a pre-saturation frequency of −1000 Hz and the lower curve for a pre-saturation frequency of −2000 Hz, and the open squares represent the CEST effect for substantially lower concentrations (0.12 mM with pH 6.5 and 0.45 mM with pH 7.2.), where again the upper squares are for a pre-saturation frequency of −1000 Hz and the lower squares for a pre-saturation frequency of −2000 Hz.

For an Yb-DOTAM-G3 concentration of 0.9 mM the following curves may be observed.

At pH 6.5, the CEST effect is around 15% for both irradiation frequencies. The amide protons can be saturated even at −1000 Hz because the peaks are very broad and shifted towards the water signal due to the fast exchange.

At pH 7.2, the CEST effect for −1000 Hz pre-saturation has increased to around 25%, because the amide proton resonances have shifted so much towards the water proton signal that the saturation efficiency, i.e. $X^{-1000}$ in equation (7), has increased strongly. On the other hand, the CEST effect for −2000 Hz pre-saturation has decreased slightly under 15%, i.e. $X^{-2000}$ has decreased.

At pH 7.5, the CEST effects for both −1000 Hz and −2000 Hz pre-saturation have decreased, but the relative decrease for −2000 Hz pre-saturation is larger than for −1000 Hz, i.e. $X^{-2000}$ has decreased more than $X^{-1000}$.

For pre-saturation at −3000 Hz, the CEST effect is negligible even at high proton exchange rate (i.e. pH 7.5), as can be seen in FIG. 6 by comparing the open and filled symbols at −3000 Hz. As there is no or substantially no difference between those symbols, the CEST effect is negligible. This is in accordance with the theory that fast exchange between two exchangeable entity pools, in the example given proton pools, leads to broadening and shift towards each other of the two proton resonances, in the example given the water proton and the amide proton resonances. Therefore, at higher exchange rate CEST starts to occur at −1000 Hz, but not at −3000 Hz.

As can be seen on FIG. 7, when the concentration of the CEST contrast agent is lower, the CEST effect is smaller. If the physico-chemical parameter value, in this case the pH value, of these samples would not be known, it would be impossible to determine the pH from the CEST effect at only one pre-saturation frequency.

According to the present invention, the results for −1000 and −2000 Hz irradiation may be combined using equation (7), in order to obtain a result which is independent from the CEST contrast agent concentration, which leads to the plot in FIG. 8.

$$\frac{\left(\frac{M_0^* - M_s}{M_s}\right)^{freq2}}{\left(\frac{M_0^* - M_s}{M_s}\right)^{freq1}} = \frac{X^{freq2}}{X^{freq1}} \quad (7)$$

As can be seen, the values for the ratio of $(M_0^*-M_s)/M_s$ are strongly dependent on the pH in the clinically most relevant pH region: the value is around 1 for pH 6.5 and more than 2 for pH 7.5. This means that the contrast in a pH mapping image using this CEST agent and this concentration elimination method will be very high.

Figure 9:
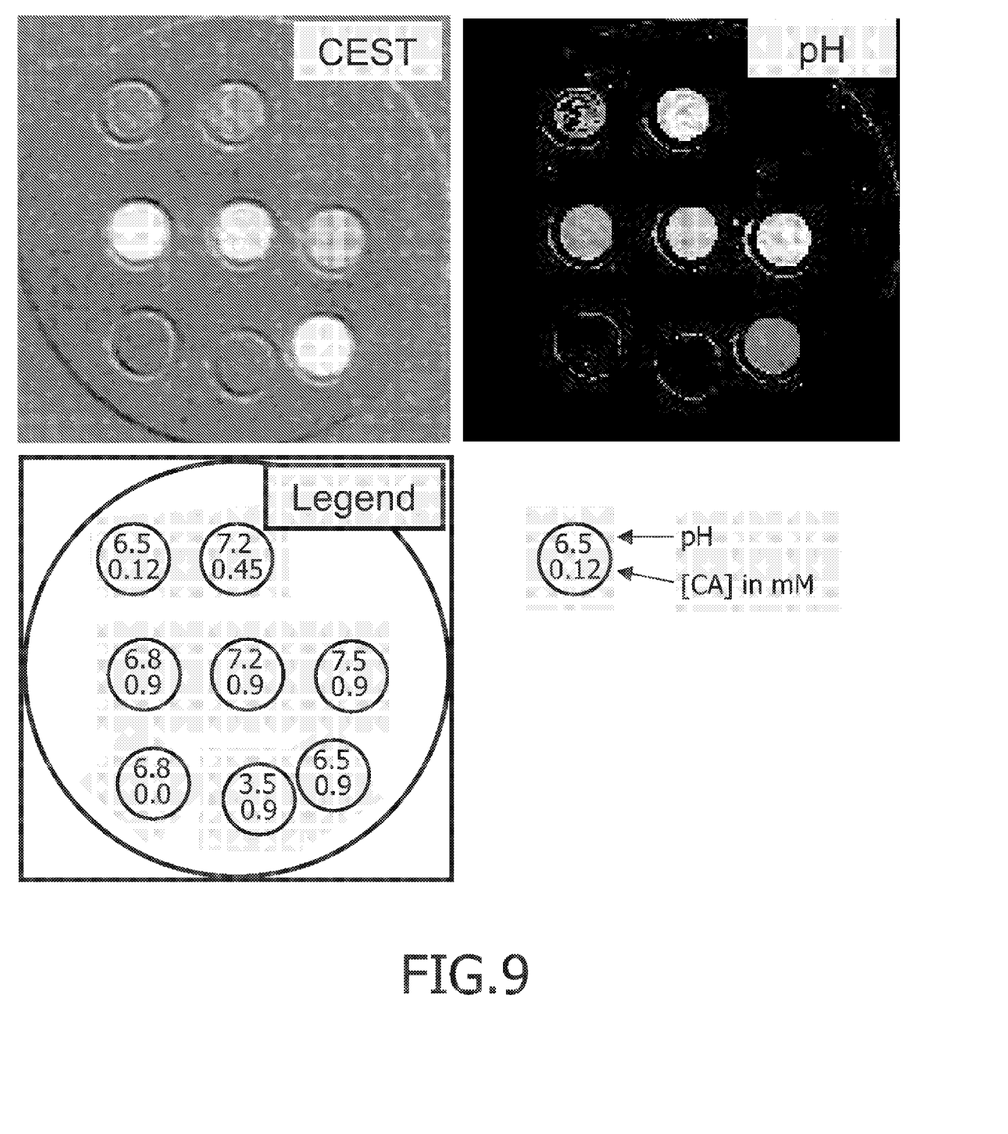
FIG. 9 represents a CEST image (top left, irradiation at −2000 Hz), and a pH map obtained by pixel-per-pixel calculation of $\{(M_o{*}-M_s)/M_s\}^{-1000}/\{(M_o{*}-M_s)M_s\}^{-2000}$ (top right).

FIG. 9 represents a CEST image (top left, irradiation at −2000 Hz), and a pH map obtained by pixel-per-pixel calculation of $\{(M_o^*-M_s)/M_s\}^{-1000}/\{(M_o^*-M_s)/M_s\}^{-2000}$ (top right) of a phantom containing vials with 0.9 mM Yb-DOTAM-G3 with MOPS buffer at various pH (middle and lower row) and two vials with significantly lower concentration of Yb-DOTAM-G3 at different pH (top row). Supposing that the concentration and pH of the two top vials is not known, from the CEST image the pH of the two top vials cannot be determined. In the pH map the intensities of the two top vials can be compared with the intensities of the vials with known concentration (0.9 mM) and pH, and so the pH of the two top vials can be determined.

When the results are compared with results obtained in WO 00/66180 (example 3, FIGS. 17 and 20) and in EP 1 331 012 (FIG. 10), which are examples of using the conventional ratiometric method, i.e. with two exchangeable proton pools, it can be seen that the contrast, determined by the difference in ratio of $(M_o^*-M_s)/M_s$ at pH=6.5 and 7.5, is similar to the result obtained by the example given above in this description. The advantage, however, of the present invention is that, according to the present invention, the use of only one exchangeable entity pool, e.g. proton pool, instead of two exchangeable entity pools, e.g. proton pools, necessary in the prior art, does not lead to loss of contrast. According to the invention, exchangeable entities may be protons, water molecules or phosphate groups.

In the present embodiment, the pH range 6.5-7.5 is considered as crucial, in case the physico-chemical parameter is pH, since it represents the clinically most relevant range of pH. According to this embodiment, a CEST agent has to fulfill the following condition to obtain a high contrast using this concentration dependence elimination: the CEST effect upon saturation at the frequency where the exchangeable protons resonate at no or slow exchange (in this case −2000 Hz) should reach its maximum at about pH 6.5 and exhibit a significant decrease towards pH 7.5.

In that way the pH dependence of the CEST effect in this pH range upon saturation at a frequency closer to the signal used to generate the MR image caused by CEST, e.g. the water proton signal in case of proton imaging, will automatically be very different, leading to a high sensitivity of the ratiometric method in the clinically relevant pH range. The CEST agent Yb-DOTAM-G3, used in the present embodiment of the invention, fulfils this condition.

In case the physico-chemical parameter is pH, other pH values than the most common range 6.5-7.5 might be of interest too, for instance in the stomach the pH is much lower, i.e. in the order of 3 to 5. For pH mapping of, for example, the stomach using the CEST method of this invention, a CEST contrast agent may be required with a maximum CEST effect for 'no-exchange' on-resonance pre-saturation at pH 3, and a decrease towards pH 5.

The method of the invention is applicable to every pH range, as long as the CEST effect for pre-saturation at the frequency where the resonance of the exchangeable protons at no- or slow exchange is observed exhibits a maximum at the lower end of the pH range of interest (or higher end when the exchange rate decreases with increasing pH).

As already indicated above, the present invention may be applied not only for pH but also for other physico-chemical parameter mapping such as, for example, temperature, $pO_2$, metabolite concentration, as long as these influence the exchange rate of the exchangeable protons.

Furthermore, the present invention includes a computer program product which provides the functionality of any of the methods according to the present invention when executed on a computing device. Further, the present invention includes a data carrier such as a CD-ROM or a diskette which stores the computer product in a machine readable form and which executes at least one of the methods of the invention when executed on a computing device. Nowadays, such software is often offered on the Internet or a company Intranet for download, hence the present invention includes transmitting the computer product according to the present invention over a local or wide area network. The computing device may include one of a microprocessor and an FPGA.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method of providing a magnetic resonance (MR) image of at least a part of a body of an individual to whom an amount of a chemical exchange saturation transfer (CEST) contrast agent has been administered, the contrast agent having exchangeable entities including a measurable spin magnetic moment and forming at least one first exchangeable entity pool for exchanging the exchangeable entities with exchangeable entities of a main exchangeable entity pool naturally present in at least part of the body of the individual, the exchangeable entities of the main exchangeable entity pool having a measurable spin magnetic moment, the method comprising:

defining a range of interest of a physico-chemical parameter between a first and a second parameter value, the physico-chemical parameter influencing an exchange rate of the exchangeable entities, irradiating the CEST contrast agent with pre-saturation RF pulses having a first pre-saturation frequency for saturating exchangeable entities of the first exchangeable entity pool, irradiating the CEST contrast agent with pre-saturation RF pulses having a second pre-saturation frequency for saturating exchangeable entities of the first exchangeable entity pool, the second pre-saturation frequency being different from the first pre-saturation frequency, for the first pre-saturation frequency,
    determining a first ratio of $[(M_o-M_s)/M_s]^1$ for at least a part of the MR image and comparing values of the first ratio with a first standard curve expressing these values as function for known physico-chemical parameter values, with $[M_s]^1$ being a first intensity of a first signal used to generate the MR image for a first on-resonance frequency ($\omega 1$) using the first pre-saturation frequency, and $[M_o^*]^1$ being a second intensity of a second signal used to generate the MR image using a first off-resonance frequency ($-\omega 1$) of the first pre-saturation frequency for irradiation of the CEST contrast agent, for the second pre-saturation frequency, determining a second ratio of $[(M_o^*-M_s)/M_s]^2$ for the at least part of the MR image and comparing values of the second ratio values with a second standard curve expressing these values as function for the known physico-chemical parameter values, with $[M_s]^2$ being a third intensity of a third signal used to generate the MR image for a second on-resonance frequency ($+\omega 2$) using the second pre-saturation frequency, and $[M_o^*]^2$ being the intensity of a signal used to generate the MR image for a second off-resonance frequency ($-\omega 2$) of the second pre-saturation frequency for irradiation of the CEST contrast agent, and determining a third ratio by dividing the first ratio by the second ratio to eliminate effect of concentration of the contrast agent on the MR image for forming an enhanced image; and displaying the enhanced image on a display, wherein the first and the second frequencies are selected such that they are both capable of at least partly pre-saturating the first exchangeable entity pool at least one value within the defined range of interest of the physico-chemical parameter, and wherein the first frequency and the second frequency are selected to have a different physico-chemical parameter dependence of changes due to the CEST.

2. The method according to claim 1, wherein the physico-chemical parameter is pH.

3. The method according to claim 1, the contrast agent having exchangeable entities having a resonance frequency, wherein the first frequency corresponds to the resonance frequency at the first parameter value at which the product of resonance frequency difference $\Delta\omega$, being the difference between the first frequency and the resonance frequency of the main naturally present exchangeable entity pool, and exchangeable entity lifetime $\tau_M$ is larger than 10 seconds.

4. The method according to claim 3, wherein the second frequency is comprised between the resonance frequency of the at least one exchangeable entity at the first parameter value and the resonance frequency of the main naturally present exchangeable entity pool that is used to generate the MR image.

5. The method according to claim 1, wherein the CEST contrast agent has at least one paramagnetic ion.

6. The method according to claim 5, wherein the CEST contrast agent has multiple paramagnetic ions.

7. The method according to claim 6, wherein the CEST contrast agent has a carrier and complexes with a chelating agent and a paramagnetic ion.

8. The method according to claim 7, wherein the CEST contrast agent has a poly(propylene imine) dendrimer functioning as carrier, with Yb-DOTAM complexes covalently attached to it.

9. The method according to claim 1, the CEST contrast agent has a carrier, wherein the carrier is any of a dendrimer, a linear polymer, a liposome, a micelle, or any particle with a phospholipid or polymeric shell or core.

10. The method according to claim 1, wherein the CEST contrast agent has a single exchangeable entity pool.

11. The method according to claim 1, wherein the at least one exchangeable entity pool of the CEST contrast agent is at least one exchangeable proton pool and the main naturally present exchangeable entity pool is a free water proton pool.

12. The method according to claim 11, wherein the CEST contrast agent has a single exchangeable proton pool.

13. The method according to claim 1, wherein the off-resonance irradiation is symmetric off-resonance irradiation, whereby the frequency at which the off-resonance irradiation occurs is positioned at the opposite side of the frequency spectrum relative to the resonance frequency of the main naturally present exchangeable entity pool.

14. A tangible computer readable medium embodying non-transitory computer instructions for providing a magnetic resonance (MR) image of at least a part of a body of an individual to whom an amount of a chemical exchange saturation transfer (CEST) contrast agent has been administered, the contrast agent having exchangeable entities including a measurable spin magnetic moment and forming at least one first exchangeable entity pool for exchanging the exchangeable entities with exchangeable entities of a main exchangeable entity pool naturally present in at least part of the body of the individual, the exchangeable entities of the main exchangeable entity pool having a measurable spin magnetic wherein, when the non-transitory computer instructions are executed on a processing device, enables the at least the following steps:

defining a range of interest of a physico-chemical parameter between a first and a second parameter value, the physico-chemical parameter influencing an exchange rate of the exchangeable entities, irradiating a chemical exchange saturation transfer (CEST) contrast agent with pre-saturation RF pulses having a first pre-saturation frequency for saturating exchangeable entities of the first exchangeable entity pool, irradiating the CEST contrast agent with pre-saturation RF pulses having a second pre-saturation frequency for saturating exchangeable entities of the first exchangeable entity pool, the second pre-saturation frequency being different from the first pre-saturation frequency, and for the first pre-saturation frequency, determining a first ratio of $[(M_o^*-M_s)/M_s]^1$ for at least a part of the MR image and comparing values of the first ratio values with a first standard curve expressing these values as function for known physico-chemical parameter values, with $[M_s]^1$ being a first intensity of a first signal used to generate the MR image for a first on-resonance frequency ($+\omega 1$) using the first pre-saturation frequency and $[M_o^*]^1$ being a second intensity of a second signal used to generate the MR image using a first off-resonance frequency ($-\omega 1$) of the first pre-saturation frequency for irradiation of the CEST contrast agent, for the second pre-saturation frequency, determining a second ratio of $[M_o^*-M_s)]^2$ for the at least part of the MR image and comparing values of the second ratio values with a second standard curve expressing these values as function for the known physico-chemical parameter values, with $[M_s]^2$ being a third intensity of a third signal used to generate the MR image for a second on-resonance frequency ($+\omega 2$) using the second pre-saturation frequency, and $[M_o]^2$ being the intensity of a signal used to generate the MR image for a second off-resonance frequency ($-\omega 2$) of the second pre-saturation frequency for irradiation of the CEST contrast agent, and determining a third ratio by dividing the first ratio by the second ratio to eliminate effect of concentration of the contrast agent on the MR image for forming an enhanced image; and displaying the enhanced image on a display, wherein the first and the second frequencies are selected such that they are both capable of at least partly pre-saturating the first exchangeable entity pool at least one value within the defined range of interest of the physico-chemical parameter, and wherein the first frequency and the second frequency are selected to have a different physico-chemical parameter dependence of changes due to the CEST effect.

* * * * *